(12) United States Patent
Banine et al.

(10) Patent No.: US 7,763,871 B2
(45) Date of Patent: Jul. 27, 2010

(54) RADIATION SOURCE

(75) Inventors: Vadim Yevgenyevich Banine, Helmond (NL); Vladimir Vitalevich Ivanov, Moscow (RU)

(73) Assignee: ASML Netherlands B.V., Veldhoven (NL)

( * ) Notice: Subject to any disclaimer, the term of this patent is extended or adjusted under 35 U.S.C. 154(b) by 120 days.

(21) Appl. No.: 12/078,663

(22) Filed: Apr. 2, 2008

(65) Prior Publication Data

US 2009/0250639 A1 Oct. 8, 2009

(51) Int. Cl.
*A61N 5/06* (2006.01)
(52) U.S. Cl. .................................. 250/504 R; 250/493.1
(58) Field of Classification Search ........................ None
See application file for complete search history.

(56) References Cited

U.S. PATENT DOCUMENTS

| 6,469,310 | B1 | 10/2002 | Fiedorowicz et al. | |
|---|---|---|---|---|
| 6,493,423 | B1 | 12/2002 | Bisschops | |
| 2006/0163500 | A1 | 7/2006 | Inoue et al. | |
| 2006/0186356 | A1 | 8/2006 | Imai | |
| 2006/0219959 | A1* | 10/2006 | Hergenhan et al. | 250/504 R |
| 2006/0243927 | A1 | 11/2006 | Tran et al. | |
| 2007/0029511 | A1* | 2/2007 | Akins et al. | 250/504 R |
| 2008/0258085 | A1* | 10/2008 | Bauer | 250/504 R |

FOREIGN PATENT DOCUMENTS

| JP | 2003-8124 A | 1/2003 |
|---|---|---|
| JP | 2005-197081 A | 7/2005 |
| WO | 01/31678 A1 | 5/2001 |
| WO | 2004/092693 A2 | 10/2004 |

OTHER PUBLICATIONS

International Search Report and Written Opinion issued on Feb. 4, 2009 in International Application No. PCT/IB2008/002201.

* cited by examiner

*Primary Examiner*—Bernard E Souw
*Assistant Examiner*—Andrew Smyth
(74) *Attorney, Agent, or Firm*—Pillsbury Winthrop Shaw Pittman LLP

(57) ABSTRACT

A radiation source includes a chamber, a supply constructed and arranged to supply a substance to the chamber at a location that allows the substance to pass through an interaction point within the chamber, a laser constructed and arranged to provide a laser beam to the interaction point so that a radiation emitting plasma is produced when the laser beam interacts with the substance at the interaction point, and a conduit constructed and arranged to deliver a buffer gas into the chamber. The conduit has an outlet located adjacent to the interaction point.

18 Claims, 3 Drawing Sheets

RADIATION SOURCE

FIELD

The present invention relates to a radiation source, a method of generating radiation, and to a lithographic apparatus which includes the radiation source.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

In order to be able to project ever smaller structures onto substrates, it has been proposed to use extreme ultraviolet radiation having a wavelength within the range of 10-20 nm, for example within the range of 13-14 nm. It has further been proposed that radiation with a wavelength of less than 10 nm could be used, for example 6.7 nm or 6.8 nm. In the context of lithography, wavelengths of less than 10 nm are sometimes referred to as 'beyond EUV'.

Extreme ultraviolet radiation and beyond EUV radiation may be produced using a plasma. The plasma may be created for example by directing a laser at particles of a suitable material (e.g. tin), or by directing a laser at a stream of a suitable gas (e.g. Sn vapor, $SnH_4$, or a mixture of Sn vapor and any gas with a small nuclear charge (for example from $H_2$ up to Ar)). The resulting plasma emits extreme ultraviolet radiation (or beyond EUV radiation), which may be collected and focused to a focal point using a collector mirror.

In addition to extreme ultraviolet radiation (or beyond EUV radiation), the plasma produces debris in the form of particles, such as thermalized atoms, ions, nanoclusters, and/or microparticles. The debris may cause damage to the collector mirror (or other components). A buffer gas may be provided in the vicinity of the plasma. The particles produced by the plasma collide with molecules of the buffer gas, and thereby lose energy. In this way, at least some of the particles may be slowed sufficiently that they do not reach the collector mirror. Damage caused to the collector mirror may thereby be reduced. However, even when buffer gas is used, some particles may still reach the collector mirror and cause damage to it.

It is desirable to improve the effectiveness of the buffer gas.

SUMMARY

According to an aspect of the invention there is provided a radiation source comprising a chamber and a supply of a plasma generating substance, the source having an interaction point at which the plasma generating substance introduced into the chamber may interact with a laser beam and thereby produce a radiation emitting plasma, wherein the source further comprises a conduit arranged to deliver a buffer gas into the chamber, the conduit having an outlet which is adjacent to the interaction point.

According to an aspect of the invention, there is provided a radiation source that includes a chamber, a supply constructed and arranged to supply a substance to the chamber at a location that allows the substance to pass through an interaction point within the chamber, a laser constructed and arranged to provide a laser beam to the interaction point so that a radiation emitting plasma is produced when the laser beam interacts with the substance at the interaction point, and a conduit constructed and arranged to deliver a buffer gas into the chamber. The conduit has an outlet located adjacent to the interaction point.

According to an aspect of the invention there is provided a method of generating radiation comprising introducing a plasma generating substance into a chamber and directing a laser beam at it in order to produce a radiation emitting plasma, wherein the method further comprises introducing buffer gas into the chamber at a location which is adjacent to a point at which the laser beam and the plasma generating substance interact.

According to an aspect of the invention, there is provided a method of generating radiation. The method includes introducing a plasma generating substance into a chamber; directing a laser beam at the plasma generating substance in order to produce a radiation emitting plasma, and introducing buffer gas into the chamber at a location adjacent to a point at which the laser beam and the plasma generating substance interact.

According to an aspect of the invention there is provided a lithographic apparatus comprising a source of radiation, an illumination system for conditioning the radiation, a support structure for supporting a patterning device, the patterning device serving to impart the radiation beam with a pattern in its cross-section, a substrate table for holding a substrate, and a projection system for projecting the patterned radiation beam onto a target portion of the substrate, wherein the radiation source comprises a chamber and a supply of a plasma generating substance, the source having an interaction point at which the plasma generating substance introduced into the chamber may interact with a laser beam and thereby produce a radiation emitting plasma, the source further comprising a conduit arranged to deliver a buffer gas into the chamber, and the conduit having an outlet which is adjacent to the interaction point.

According to an aspect of the invention, there is provided a lithographic apparatus that includes a source of radiation. The source of radiation includes a chamber, a supply constructed and arranged to supply a substance to the chamber at a location that allows the substance to pass through an interaction point within the chamber, a laser constructed and arranged to provide a laser beam to the interaction point so that a radiation emitting plasma is produced when the laser beam interacts with the substance at the interaction point, and a conduit constructed and arranged to deliver a buffer gas into the chamber. The conduit has an outlet located adjacent to the interaction point. The lithographic apparatus also includes an illumination system configured to condition the radiation into a radiation beam, and a support structure configured to support a patterning device. The patterning device is constructed and arranged to impart the radiation beam with a pattern in its cross-section. The lithographic apparatus further includes a substrate table configured to hold a substrate, and a projection system configured to project the patterned radiation beam onto a target portion of the substrate.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
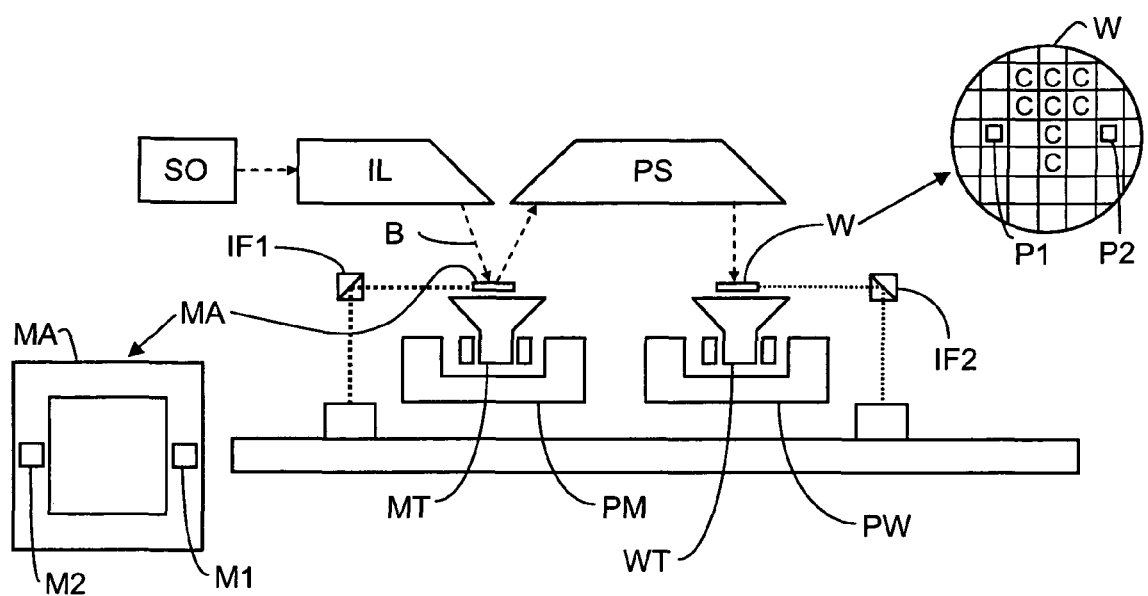
FIG. 1 depicts a lithographic apparatus according to an embodiment of the invention.

FIG. 1 schematically depicts a lithographic apparatus according to one embodiment of the invention. The apparatus comprises: an illumination system (illuminator) IL configured to condition a radiation beam B (e.g. EUV radiation or beyond EUV radiation); a support structure (e.g. a mask table) MT constructed to support a patterning device (e.g. a mask) MA and connected to a first positioner PM configured to accurately position the patterning device in accordance with certain parameters; a substrate table (e.g. a wafer table) WT constructed to hold a substrate (e.g. a resist-coated wafer) W and connected to a second positioner PW configured to accurately position the substrate in accordance with certain parameters; and a projection system (e.g. a refractive projection lens system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

Examples of patterning devices include masks and programmable mirror arrays. Masks are well known in lithography, and typically in an EUV or beyond EUV lithographic apparatus would be reflective. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system. Usually, in an EUV or beyond EUV lithographic apparatus the optical elements will be reflective. However, other types of optical element may be used. The optical elements may be in a vacuum. Any use of the term "projection lens" herein may be considered as synonymous with the more general term "projection system".

As here depicted, the apparatus is of a reflective type (e.g. employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

Referring to FIG. 1, the illuminator IL receives a radiation beam from a radiation source SO. The source and the lithographic apparatus may be separate entities. In such cases, the source is not considered to form part of the lithographic apparatus and the radiation beam is passed from the source SO to the illuminator IL with the aid of a beam delivery system comprising, for example, suitable directing mirrors and/or a beam expander. In other cases the source may be an integral part of the lithographic apparatus. The source SO and the illuminator IL, together with the beam delivery system if required, may be referred to as a radiation system.

The illuminator IL may comprise an adjuster for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator and a condenser. The illuminator may be used to condition the radiation beam B to have a desired uniformity and intensity distribution in its cross-section.

The radiation beam B is incident on the patterning device (e.g., mask MA), which is held on the support structure (e.g., mask table MT), and is patterned by the patterning device. Having been reflected by the mask MA, the radiation beam B passes through the projection system PS, which focuses the beam onto a target portion C of the substrate W. With the aid of the second positioner PW and position sensor IF2 (e.g. an interferometric device, linear encoder or capacitive sensor), the substrate table WT can be moved accurately, e.g. so as to position different target portions C in the path of the radiation beam B. Similarly, the first positioner PM and another position sensor IF1 can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the radiation beam is projected onto a target portion C (i.e. a single dynamic exposure). The velocity and direction of the substrate table WT relative to the mask table MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2A:
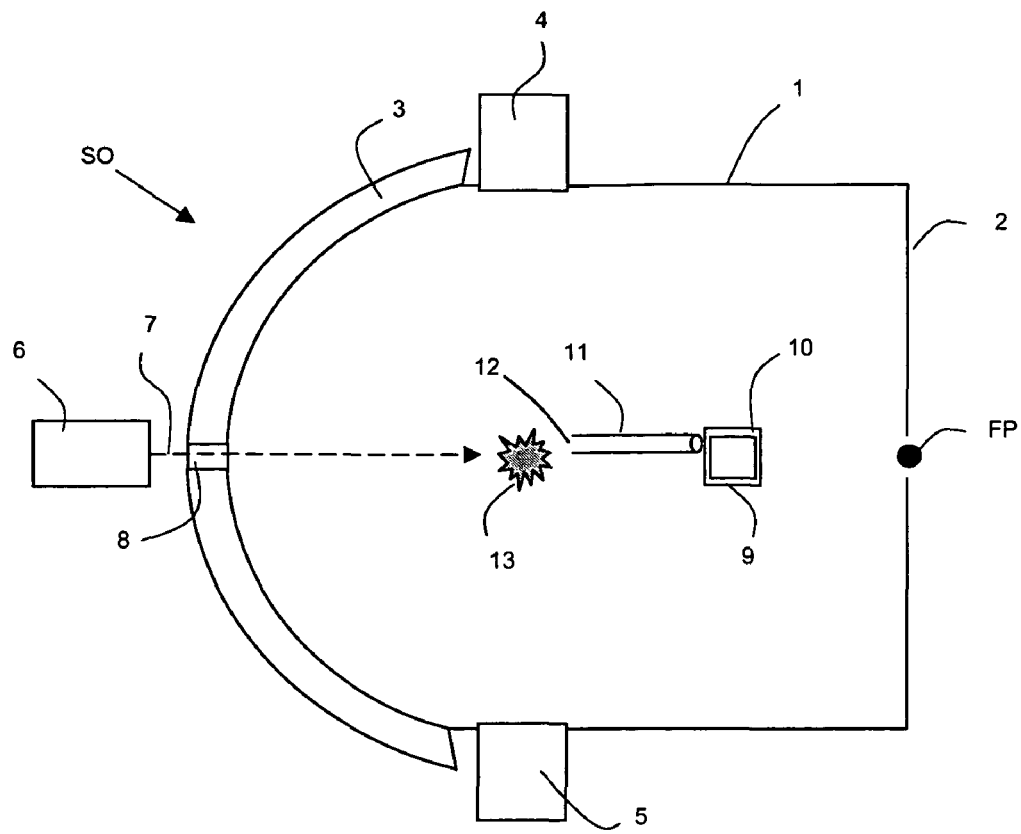
FIGS. 2a and 2b depict a radiation source according to an embodiment of the invention.
Figure 2B:
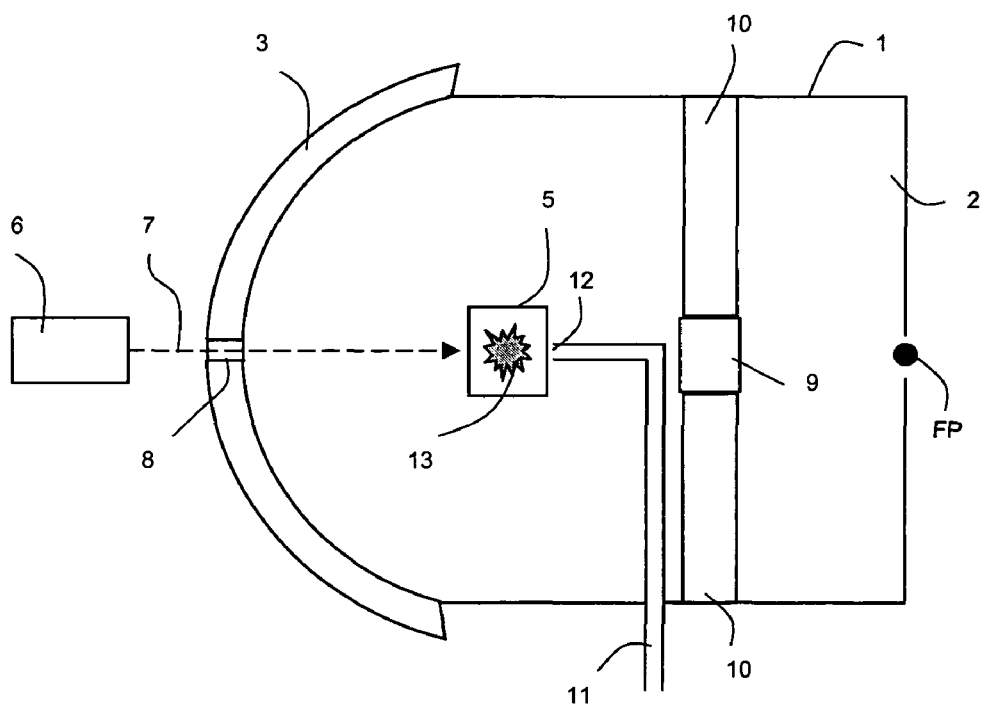

FIGS. 2a and 2b show schematically a source SO according to an embodiment of the invention. FIG. 2a shows the source SO in cross section viewed from one side, and FIG. 2b shows the source in cross section viewed from above.

The source SO comprises a chamber 1. The chamber 1 is defined by walls 2 and a collector mirror 3. The collector mirror 3 has a reflective surface which is reflective at extreme ultraviolet radiation wavelengths.

A supply 4 is arranged to supply droplets of material (for example tin) into the chamber 1. A collector 5 is located beneath the supply 4 at the bottom of the chamber 1, and is arranged to collect material which has passed through the chamber 1.

The collector mirror 3 is arranged to focus radiation to a focal point FP, from where the radiation may pass into the illuminator IL of the lithographic apparatus (see FIG. 1). A laser 6 is used to generate a beam of radiation 7 which is directed into the chamber 1 via an aperture 8. The aperture 8 may for example comprise a window which is transmissive at the wavelength of the laser beam 7. A beam dump 9 is located within the chamber 1, and is positioned such that any portion of the laser beam 7 which does not interact with material provided by the material supply 4 is incident upon (and absorbed by) the beam dump. Gas coolers 10 extend into the chamber 1 from side walls of the chamber.

A buffer gas supply comprises a conduit 11 which extends into the chamber 1 from a side wall of the chamber, and has an outlet 12 which delivers buffer gas adjacent to an interaction point 13 at which the laser beam 7 is incident upon material supplied from the material supply 4.

In use, the chamber 1 is filled with a suitable buffer gas (for example hydrogen). The laser 6 generates a laser beam 7, which passes through the aperture 8 in the collector mirror 3 and into the chamber 1. The material supply 4 produces a droplet of material which falls downwards through the chamber 1 towards the collector 5. When the droplet of material passes through the interaction point 13, the interaction of the laser beam 7 and the droplet of material causes at least some of the material to be converted into a plasma. The plasma emits extreme ultraviolet radiation, which is collected by the collector mirror 3 and focused to the focal point FP. The extreme ultraviolet radiation passes from the focal point FP into the illuminator IL of the lithographic apparatus (see FIG. 1).

Parts of the droplet of material which do not interact with the laser beam 7 continue to fall through the chamber 1 and are collected by the collector 5.

The plasma generated by the interaction of the laser beam 7 and the droplet of material may include particles which would cause damage to the collector mirror 3. The buffer gas present in the chamber 1 is intended to slow down the particles so that they do not reach the collector mirror 3. However, the violence of the interaction between the laser beam 7 and the tin particle at the interaction point 13 is such that the buffer gas is heated and pushed away from the interaction point when the laser beam interacts with the droplet of material. This may cause the buffer gas in a region around the interaction point to have a higher temperature and a lower density.

In a conventional extreme ultraviolet radiation source (in which the buffer gas is introduced from a sidewall of the chamber), some time will elapse before the heated buffer gas moves away from the region around the interaction point 13 (the heated buffer gas may for example move towards the gas coolers 10). The time taken for the heated buffer gas to move away from the region around the interaction point 13 may for example be of the order of tens of milliseconds. The time between delivery of successive droplets of material to the interaction point 13 may be significantly shorter than this, for example 10-20 microseconds. This means that the heated buffer gas may remain present in the region around the interaction point 13 during the generation of successive pulses of EUV radiation.

The region around the interaction point 13 which is occupied by the heated buffer gas may comprise a significant proportion of the volume between the interaction point 13 and the collector mirror 3. The heated buffer gas in this region has a lower density than gas which has not been heated, and a result there are less interactions between the particles of the plasma and the buffer gas. Consequently, it is more likely that particles may reach the collector mirror 3. When this occurs, damage may be caused to the collector mirror 3.

There is an additional effect which may contribute to the problem described above. Many of the fast ions generated at the interaction point 13 are moving in the direction of the collector mirror 3. When these fast ions are stopped by the buffer gas, they transfer their momentum to the buffer gas, thereby causing the buffer gas to flow in the direction of the collector mirror 3. This further reduces the density of the buffer gas in the region around the interaction point 13.

The above problem may be solved or reduced in magnitude by the conduit 11 shown in FIG. 2. The conduit 11 has an outlet 12 which is located adjacent to the interaction point 13, and thereby delivers unheated buffer gas adjacent to the interaction point 13. Thus, instead of unheated buffer gas flowing into the region around the interaction point 13 only after heated buffer gas has moved away from that region, the outlet 12 of the conduit 11 immediately and directly delivers unheated buffer gas into the region around the interaction point 13. Consequently, by the time the next droplet of material has reached the interaction point 13, newly delivered buffer gas will be present in the region around the interaction point 13.

This newly delivered buffer gas is unheated and is therefore more dense than heated buffer gas. The buffer gas is therefore more effective. The embodiment of the invention therefore may provide improved protection of the collector mirror 3 from particles generated during plasma formation. It may therefore allow the collector mirror 3 to have a longer lifetime before cleaning and/or replacement than may otherwise be the case.

The buffer gas may be delivered with a high velocity (for example 100-2000 m/s). This may provide the advantage that it quickly pushes away heated buffer gas from the region around the interaction point 13. The buffer gas may be delivered in a supersonic gas jet which is directed at or adjacent to the interaction point 13. The supersonic gas jet may have the advantage that the density of buffer gas within the jet may be substantially larger than the mean density of buffer gas in the chamber, thereby providing an increased interaction of fast ions with the buffer gas adjacent to the interaction point 13.

Since the conduit 11 is introducing buffer gas into the chamber 1, one or more vents (not shown) may be used to carry buffer gas from the chamber 1, and thereby regulate the pressure of buffer gas within the chamber. The gas coolers 10 regulate the temperature of the buffer gas.

The conduit 11 is provided at a location which is selected such that extreme ultraviolet radiation which is obscured by the conduit 11 would have been obscured by other elements of the apparatus if the conduit 11 were not present. Thus, the conduit 11 is located in front of a gas cooler 10 which would obscure the EUV radiation irrespective of whether or not the conduit 11 is present. The conduit 11 is vertically displaced with respect to the laser beam 7, so that the laser beam does not pass into the conduit 11, but instead travels next to it and is incident upon the beam dump 9.

As has previously been mentioned, the outlet of the conduit 11 is adjacent to the interaction point 13. The outlet of the conduit 11 may be within the outer boundary of a region within which heated buffer gas would be continually present during operation of the EUV source if buffer gas were not supplied through the conduit 11.

The distance between the outlet 12 of the conduit 11 and the interaction point 13 may be selected by considering the following: the closer the outlet 12 is to the interaction point 13, the more effective the delivery of unheated buffer gas to the region around the interaction point 13. However, the closer the outlet 12 is to the interaction point 13, the more the conduit 11 is likely to suffer from sputtering of ions against the conduit. In one example, the outlet 12 may be about 15 cm or less from the interaction point, and may be about 10 cm or less from the interaction point. The outlet may be about 3 cm or more from the interaction point. The distance between the interaction point 13 and the collector mirror 3 may be about 20 cm.

The rate at which buffer gas is provided through the outlet 12 may be sufficient to substantially remove heated buffer gas from the region around the interaction point 13. The rate may be sufficient to achieve this before the next laser and material droplet interaction. The rate at which buffer gas should be provided through the outlet 12 in order to achieve this may be calculated based upon the volume of buffer gas that is heated by a laser and material droplet interaction, and the frequency at which laser and material droplet interactions take place (i.e. the frequency of the EUV source).

Figure 3:
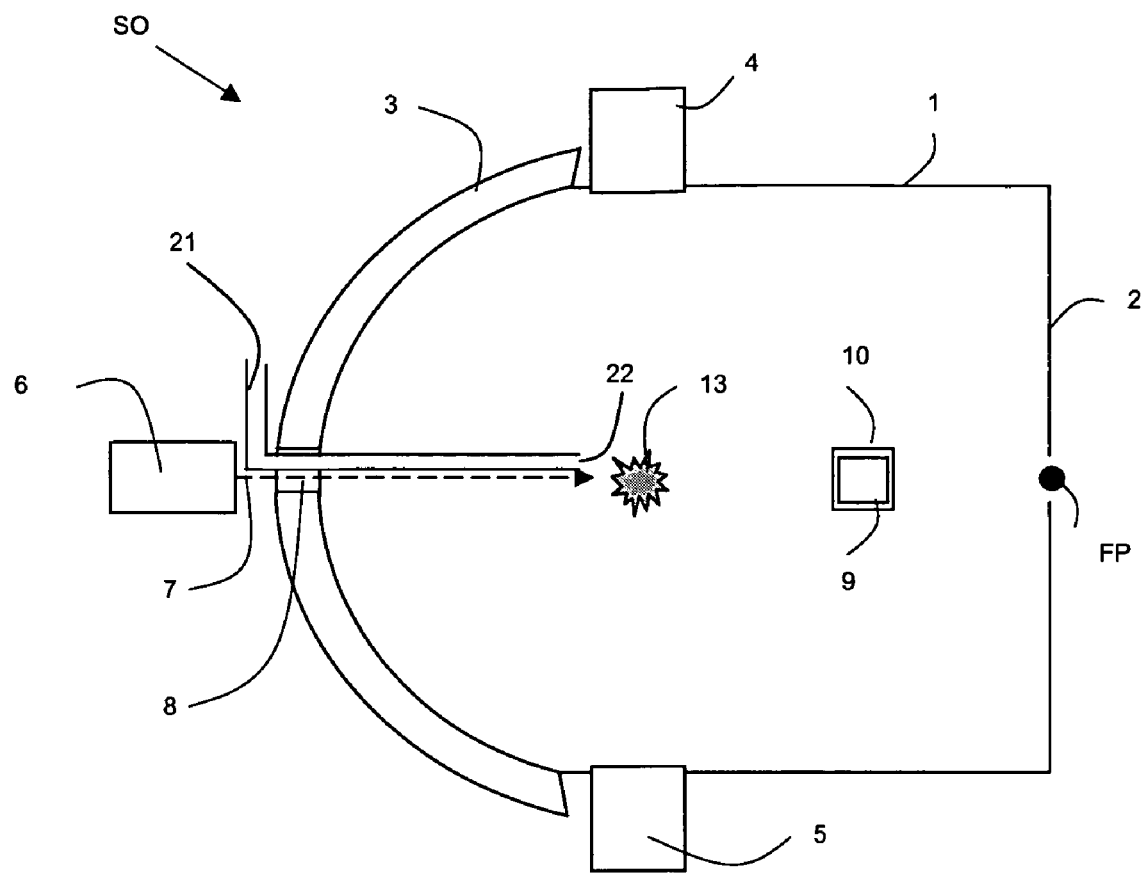
FIG. 3 depicts a radiation source according to an alternative embodiment of the invention.

An embodiment of the invention is shown schematically in FIG. 3. FIG. 3 shows a source SO viewed from one side. The majority of elements of the source SO shown in FIG. 3 correspond with those shown in FIGS. 2a and 2b, and are not described again here. However, the conduit 11 of FIG. 2b is not present in FIG. 3. Instead, a conduit 21 passes through the aperture 8 in the collector mirror 3, and travels parallel to the laser beam 7. The conduit 21 is provided with an outlet 22 which is adjacent to the interaction point 13. The conduit 21 is used to introduce buffer gas adjacent to the interaction point 13 in an equivalent manner to that described above in relation to FIG. 2. The conduit 21 is positioned such that, while it may obscure some EUV radiation generated by the plasma in the chamber 1, the amount of EUV radiation which is obscured is relatively small (for example, only the cross-section of the conduit obscures the EUV radiation rather than its length). The distance between the outlet 22 and the interaction point 13 may be selected using the criteria that were described further above in relation to FIG. 2.

A potential advantage of the embodiment shown in FIG. 3 is that the flow of buffer gas provided by the conduit is away from the collector mirror 3 rather than towards it (thereby helping to push heated buffer gas away from the collector mirror 3).

In a modified version of the embodiment shown in FIG. 3, the conduit may consist of two tubes, one of which is inside the other. The laser beam may be arranged to pass along the inner of the two tubes, and the buffer gas may be arranged to pass along a channel formed between the two tubes. Where this is the case, the corner shown in FIG. 3 may be absent from the inner of the two tubes, in order to allow the laser beam to travel unimpeded from the laser to the interaction point.

Although conduits 11, 21 having different positions and configurations have been shown in FIGS. 2b and 3, other conduit positions and configurations may be used. It is desirable that the conduit position and configuration is such that it does not obscure any EUV radiation which would not otherwise be obscured by some other component of the source SO. In some instances, this may not be achievable or it may be desired to provide the conduit in some location wherein the conduit does indeed obscure some EUV radiation. Where this is the case, it is desirable to minimize the amount of EUV radiation which is obscured by the conduits where possible. Appropriate locations and configurations for the conduit will depend upon the particular arrangement of the source within which the conduit is provided. More than one conduit may be provided (for example the conduits shown in FIGS. 2b and 3 may both be provided in a single EUV source).

Although the above description has referred to the use of hydrogen as the buffer gas, other suitable gases may be used.

Although the above description has referred to the droplets of material being tin, other suitable materials may be used.

The invention is not limited to radiation sources which use droplets of material. An embodiment of the invention and may for example generate plasma from a gas rather than from droplets of material. Suitable gases include Sn vapor, $SnH_4$, or a mixture of Sn vapor and any gas with a small nuclear charge (for example from $H_2$ up to Ar). Droplets of material or gases may be considered to be examples of a plasma generating substance.

The wavelength of the EUV radiation referred to in the above description may for example be within the range of 10-20 nm, for example within the range of 13-14 nm.

Although the above description of embodiments of the invention relates to a radiation source which generates EUV radiation, the invention may also be embodied in a radiation source which generates 'beyond EUV' radiation, that is radiation with a wavelength of less than 10 nm. Beyond EUV radiation may for example have a wavelength of 6.7 nm or 6.8 nm. A radiation source which generates beyond EUV radiation may operate in the same manner as the radiation sources described above.

In the above description the term 'unheated buffer gas' is intended to mean buffer gas which is delivered from the outlet 12, 22 after an interaction between the laser beam and the plasma generating substance (and before the next interaction between the laser beam and the plasma generating substance).

The description above is intended to be illustrative, not limiting. Thus, it will be apparent to one skilled in the art that modifications may be made to the invention as described without departing from the scope of the claims set out below.

What is claimed is:

1. A radiation source comprising:
   a chamber;
   a supply constructed and arranged to supply a substance to the chamber at a location that allows the substance to pass through an interaction point within the chamber;
   a laser constructed and arranged to provide a laser beam to the interaction point so that a radiation emitting plasma is produced when the laser beam interacts with the substance at the interaction point;
   a collector constructed and arranged to collect radiation emitted from the plasma and focus the radiation to a focal point; and
   a conduit constructed and arranged to deliver a buffer gas into the chamber, the conduit having an outlet located adjacent to the interaction point so that the outlet is located closer to the interaction point than the collector.

2. The source of claim 1, wherein the outlet is located within the outer boundary of a region within which heated buffer gas would be continually present during operation of the source if buffer gas were not supplied through the conduit.

3. The source of claim 1, wherein the outlet of the conduit is located 15 cm or less from the interaction point.

4. The source of claim 3, wherein the outlet of the conduit is located 10 cm or less from the interaction point.

5. The source of claim 1, wherein the outlet of the conduit is located 3 cm or more from the interaction point.

6. The source of claim 1, wherein the conduit is located such that it does not obscure radiation which would not otherwise be obscured by some other component of the source.

7. The source of claim 1, wherein at least part of the conduit runs alongside a gas cooler of the source.

8. The source of claim 1, wherein at least part of the conduit passes through an aperture in the collector.

9. The source of claim 8, wherein at least part of the conduit comprises two tubes, one of which is inside the other, an inner tube being arranged such that the laser beam may pass along the inner tube, and a channel between the two tubes being arranged to allow the buffer gas to pass along the channel.

10. A method of generating radiation, comprising:
    introducing a plasma generating substance into a chamber;
    directing a laser beam at the plasma generating substance in order to produce a radiation emitting plasma;
    collecting radiation emitted from the plasma with a collector; and
    introducing buffer gas into the chamber at a location adjacent to a point at which the laser beam and the plasma generating substance interact, the location being closer to the point at which the laser beam and the plasma generating substance interact than the collector.

11. The method of claim 10, wherein the location at which the buffer gas is introduced is within the outer boundary of a region within which heated buffer gas would be continually present during operation of the source if the buffer gas were not supplied to the location adjacent the point at which the laser beam and the plasma generating substance interact.

12. The method of claim 10, wherein the buffer gas is introduced with a velocity of 100 m/s or greater.

13. The method of claim 10, wherein the buffer gas is introduced with a velocity of 2000 m/s or less.

14. The method of claim 10, wherein the rate at which buffer gas is introduced is sufficient to substantially remove heated buffer gas from a region around the point at which the laser beam and the plasma generating substance interact prior to a subsequent interaction between the laser beam and the plasma generating substance.

15. A lithographic apparatus comprising:
    a source of radiation comprising
       a chamber;
       a supply constructed and arranged to supply a substance to the chamber at a location that allows the substance to pass through an interaction point within the chamber;
       a laser constructed and arranged to provide a laser beam to the interaction point so that a radiation emitting plasma is produced when the laser beam interacts with the substance at the interaction point;
       a collector constructed and arranged to collect radiation emitted from the plasma and focus the radiation to a focal point; and
       a conduit constructed and arranged to deliver a buffer gas into the chamber, the conduit having an outlet located adjacent to the interaction point so that the outlet is located closer to the interaction point than the collector;
    an illumination system configured to condition the radiation into a radiation beam;
    a support structure configured to support a patterning device, the patterning device being constructed and arranged to impart the radiation beam with a pattern in its cross-section;
    a substrate table configured to hold a substrate; and
    a projection system configured to project the patterned radiation beam onto a target portion of the substrate.

16. The lithographic apparatus of claim 15, wherein the outlet of the conduit is located 15 cm or less from the interaction point.

17. The lithographic apparatus of claim 16, wherein the outlet of the conduit is located 10 cm or less from the interaction point.

18. The lithographic apparatus of claim 15, wherein the outlet of the conduit is located 3 cm or more from the interaction point.

* * * * *